United States Patent [19]

Barter

[11] Patent Number: 5,500,615

[45] Date of Patent: Mar. 19, 1996

[54] LOW POWER CCD DRIVER WITH SYMMETRICAL OUTPUT DRIVE SIGNAL

[75] Inventor: Archie M. Barter, Beaverton, Oreg.

[73] Assignee: Tektronix, Inc., Wilsonville, Oreg.

[21] Appl. No.: 412,352

[22] Filed: Mar. 28, 1995

Related U.S. Application Data

[63] Continuation of Ser. No. 316,412, Oct. 13, 1993, abandoned, which is a continuation of Ser. No. 989,452, Dec. 4, 1992, abandoned, which is a continuation of Ser. No. 802,983, Dec. 6, 1991, abandoned.

[51] Int. Cl.$^6$ ................................................ H03K 17/14
[52] U.S. Cl. .................... 327/111; 327/112; 327/327; 327/362; 327/405; 327/490; 326/89
[58] Field of Search ........................... 307/242, 253–255, 307/263, 264, 268, 270, 288, 475, 555; 326/82, 89; 327/102, 108, 111, 112, 170, 199, 299, 306, 327, 331, 362, 403, 405, 482, 484, 490

[56] References Cited

U.S. PATENT DOCUMENTS

| | | | |
|---|---|---|---|
| 3,319,086 | 5/1967 | Yee | 307/268 |
| 3,868,519 | 2/1975 | Green | 307/268 |
| 4,305,010 | 12/1981 | Wise | 307/255 |
| 4,323,796 | 4/1982 | Lathrope | 307/353 |
| 4,331,885 | 5/1982 | Amazawa et al. | 307/255 |
| 4,445,054 | 4/1984 | Ishii | 307/555 |
| 4,536,662 | 8/1985 | Fujii | 307/296.6 |
| 4,540,894 | 9/1985 | Park | 307/263 |
| 4,647,799 | 3/1987 | Hsu et al. | 307/475 |
| 4,682,059 | 10/1987 | Garcia | 307/496 |
| 4,728,815 | 3/1988 | Main | 307/268 |
| 4,730,124 | 3/1988 | Metz | 307/255 |
| 4,779,016 | 10/1988 | Sugiyama et al. | 307/475 |
| 4,792,704 | 12/1988 | Lobb et al. | 307/264 |
| 4,806,791 | 2/1989 | Mizuide | 307/359 |

Primary Examiner—Terry Cunningham
Attorney, Agent, or Firm—Francis I. Gray; John D. Winkelman

[57] ABSTRACT

A CCD gate driver circuit provides an output drive signal in response to an input clock signal. The output drive signal is symmetrical, uses a minimum amount of power at high frequencies, and compensates for cross-coupling between CCD gates. An input circuit receives the input clock signal and converts it to current pulses on the transitions of the input clock signal. The current pulses are applied to a common input of a pair of complementary input transistors to switch conduction of the transistors. The control inputs of the input transistors are coupled to a reference voltage level. The outputs of the input transistors are coupled to respective current mirrors. The outputs of the current mirrors are in turn coupled to respective inputs of a pair of complementary output transistors that have a common output. A pair of voltage rails that define the voltage swing of the output drive signal are coupled to the respective control inputs of the output transistors. Provision is made to compensate for capacitive intercoupling between the CCD gates being driven, and to provide a trickle current between clock signal transitions to maintain the output at the respective voltage rail.

6 Claims, 3 Drawing Sheets

5,500,615

LOW POWER CCD DRIVER WITH SYMMETRICAL OUTPUT DRIVE SIGNAL

This is a continuation of application Ser. No. 08/316,412 filed Oct. 13, 1993, and now abandoned, which was a continuation of application Ser. No. 07/989,452 filed Dec. 4, 1992 and now abandoned, which was a continuation of application Ser. No. 07/802,983 filed Dec. 6, 1991 and now abandoned.

BACKGROUND OF THE INVENTION

The present invention relates to amplifier circuits, and more particularly to a CCD gate driver circuit that drives the gate capacitance of a CCD at high frequencies between two arbitrary voltage limits while requiring low bias current from the circuit power supply after a transition.

In driving the gates of a CCD (Charge Coupled Device) device it is necessary to convert an ECL or TTL clock signal to appropriate voltage limit levels compatible with the CCD device. The voltage limit levels may encompass ground potential, i.e., +8 to −3 volts, or may be completely above ground potential, i.e., +8 to +1 volts. Therefore a gate driver for a CCD device needs flexibility. In order to achieve such flexibility the logic input signal and circuit power supplies need to be independent, i.e., have different reference levels. Also, especially for high frequency applications, a symmetrical gate drive signal is desired with rapid transition from one voltage limit level to the other. Another desirable feature is to have low power usage, especially for surface mount circuitry, to avoid excessive heating of the active circuit components. Finally the voltage output level may be affected by gate to gate overlap capacitance in the CCD device, so that such effect needs to be compensated.

One typical gate driver is the DS0026 gate driver, manufactured by National Semiconductor of Santa Clara, Calif. However the input and output are tied to the same power supply levels. Also the output provides an asymmetrical output waveform which is not desirable for high frequency applications. Another CCD driver is the TSC430, manufactured by Teledyne Components of Mountain View, Calif. This driver has the input and output power supplies decoupled, but uses complementary FETs so that during transition there is a crossover current through both FETs. At high frequencies these FETs get hot and use a considerable amount of power. Also the rise time at the output is a function of the "ON" impedance of the FETs. A proprietary CCD driver circuit, developed by Tektronix, Inc. of Beaverton, Oreg., uses an output current source truncated at the voltage limit level. However this circuit is not convenient for TTL logic inputs, and current flows constantly between the voltage rails so that the circuit generates excessive heat.

Therefore what is desired is a CCD gate driver that provides a current output between two voltage limit levels at high frequencies without generating excessive heat while still providing a symmetrical output with the flexibility to accommodate various output voltage limit levels.

SUMMARY OF THE INVENTION

Accordingly the present invention provides a CCD gate driver that has an input section to limit the input current so that significant current flows only during transitions. This allows transistors in an output section to switch quickly in response to transitions of a clock signal at the input section. The output section has voltage limit voltages as inputs and provides an output drive signal in response to the clock signal applied to the input section. The output drive signal is limited by the voltage limit voltages. Upper and lower current mirrors couple the input section to the output section, with the input section having a reference voltage level that is independent of the power supply voltage levels. A resistive voltage divider in the input section provides a trickle current to assure that one of the transistors in the output section is maintained in saturation between transitions. Further a separate input is provided in the input section to accept an inverted input signal from an adjacent CCD gate driver to counteract the effect of gate to gate overlap capacitance that tends to pull the output transistors out of saturation. Also a current sink is provided in the output section to sink excess counteracting current from the gate to gate overlap capacitance that tends to pull the output transistors further into saturation.

The objects, advantages and novel features of the present invention are apparent from the following detailed description when read in conjunction with the appended claims and attached drawing.

DESCRIPTION OF THE PREFERRED EMBODIMENT

Figure 1:
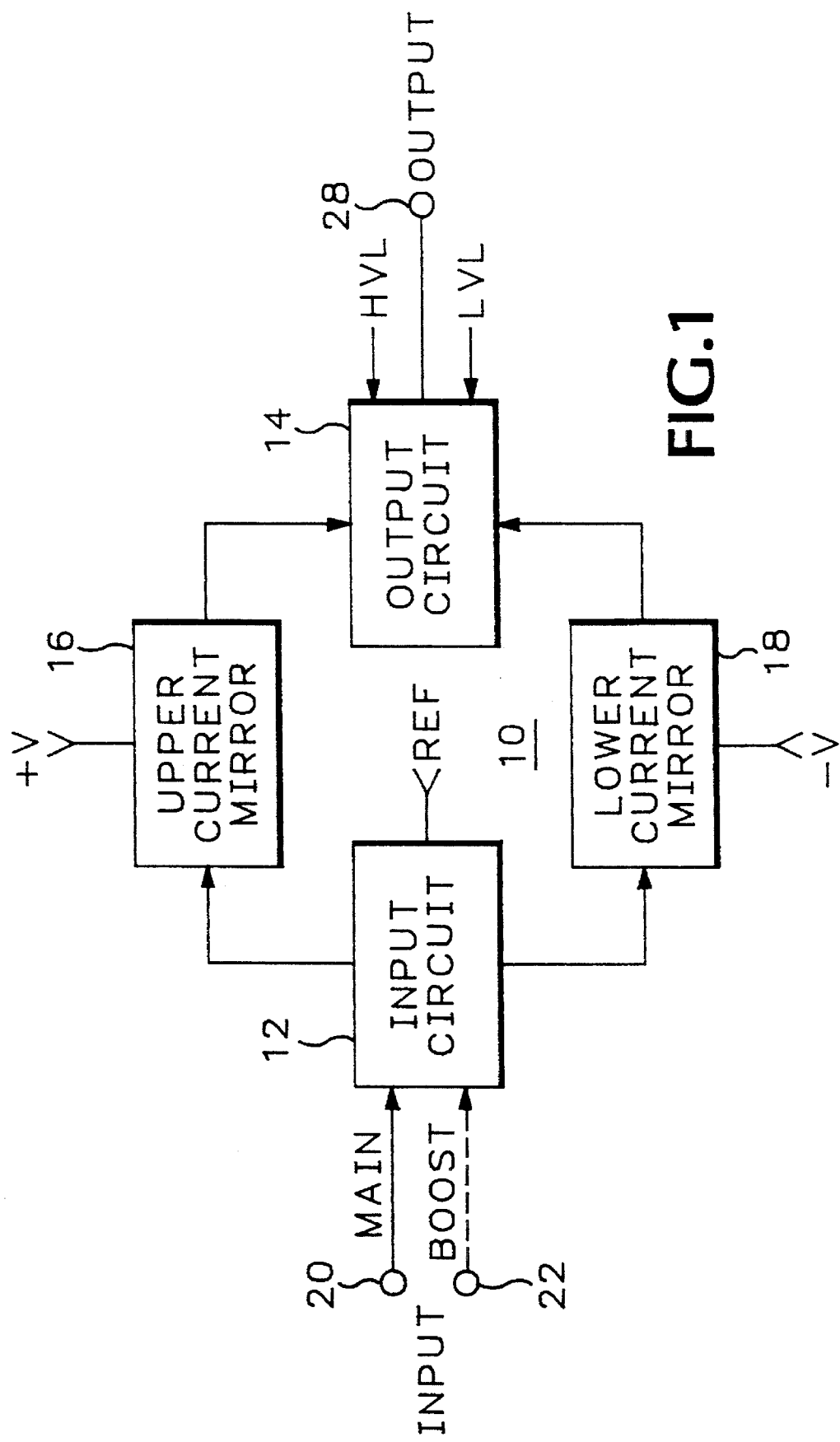
FIG. 1 is a block diagram of a CCD gate driver according to the present invention.
Figure 2:
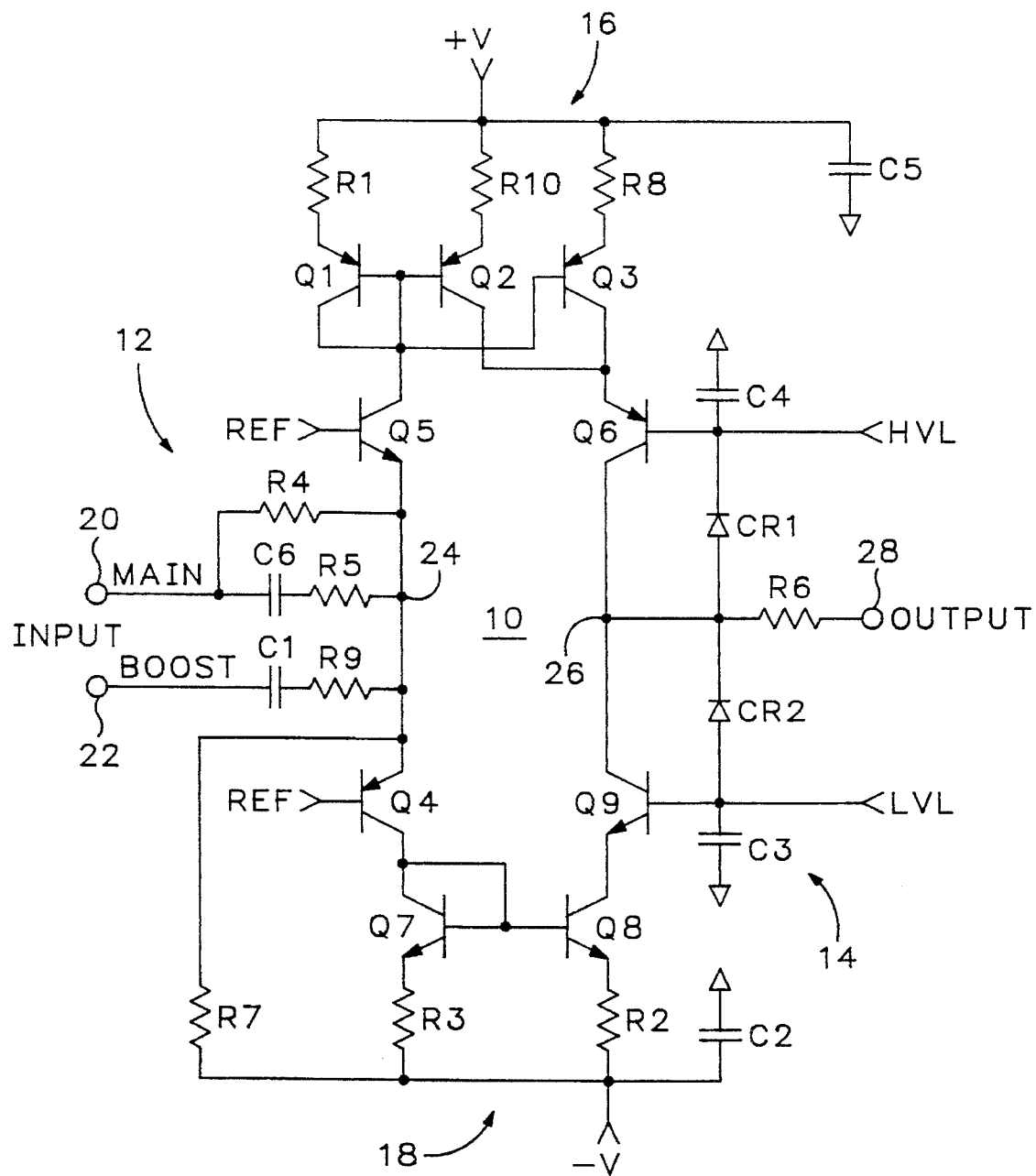
FIG. 2 is a schematic diagram of a CCD gate driver of FIG. 1.

Referring now to FIGS. 1 and 2 a CCD gate driver 10 has an input section 12, an output section 14, an upper current mirror 16 and a lower current mirror 18, with the upper and lower current mirrors coupling the input section to the output section. The input section has a pair of complementary input transistors Q4, Q5 having their emitters coupled together to form an input node 24. Their bases are coupled to a reference voltage level REF, such as ground potential. A main input terminal 20 is coupled to the input node 24 via a first series RC circuit C6, R5. A voltage divider of resistors R4, R7 is coupled between the main input terminal 20 and a negative voltage rail −V, with the junction between the resistors coupled to the input node 24. A compensation input terminal 22 also is coupled to the input node 24 via a second series RC circuit C1, R9.

The output section 14 includes a pair of complementary output transistors Q6, Q9 having the collectors coupled together to form an output node 26 and also coupled to an output terminal 28 via an output resistor R6. A high voltage limit signal HVL is applied to the base of one Q6 of the complementary output transistors, and a low voltage limit signal LVL is applied to the base of the other one Q9 of the complementary output transistors. A pair of diodes CR1, CR2 are coupled in series between the bases of the complementary output transistors Q6, Q9, with the junction between the diodes coupled to the output node 26. Also coupled between ground potential and the bases of the complementary output transistors Q6, Q9 are respective sink capacitors C4, C3.

The upper current mirror 16 is coupled between the collector of the one complementary input transistor Q5, the emitter of the one complementary output transistor Q6 and a positive voltage rail +V. Upper current mirror transistors Q1, Q2, Q3 have their emitters coupled to the positive voltage rail +V via respective resistors R1, R10, R8 and their bases coupled to the collector of the one complementary input transistor Q5. The collector of the first upper current mirror transistor Q1 is coupled to its base. The collectors of the second and third upper current mirror transistors Q2, Q3 are coupled to each other and to the emitter of the one complementary output transistor Q6. The second and third upper current mirror transistors Q2, Q3 may be replaced by a single transistor. A first a.c. bypass capacitor C5 is coupled between the positive voltage rail +V and ground potential.

Likewise the lower current mirror 18 is coupled between the collector of the other complementary input transistor Q4, the emitter of the other complementary output transistor Q9 and the negative voltage rail −V. Lower current mirror transistors Q7, Q8 have their emitters coupled via respective resistors R3, R2 to the negative voltage rail −V, and their bases are coupled to each other. The collector of the first lower current mirror transistor Q7 is coupled to its base and to the collector of the other complementary input transistor Q4. The collector of the second lower current mirror transistor Q8 is coupled to the emitter of the other complementary output transistor Q9. A second a.c. bypass capacitor C2 is coupled between the negative voltage rail −V and ground potential.

Figure 3:
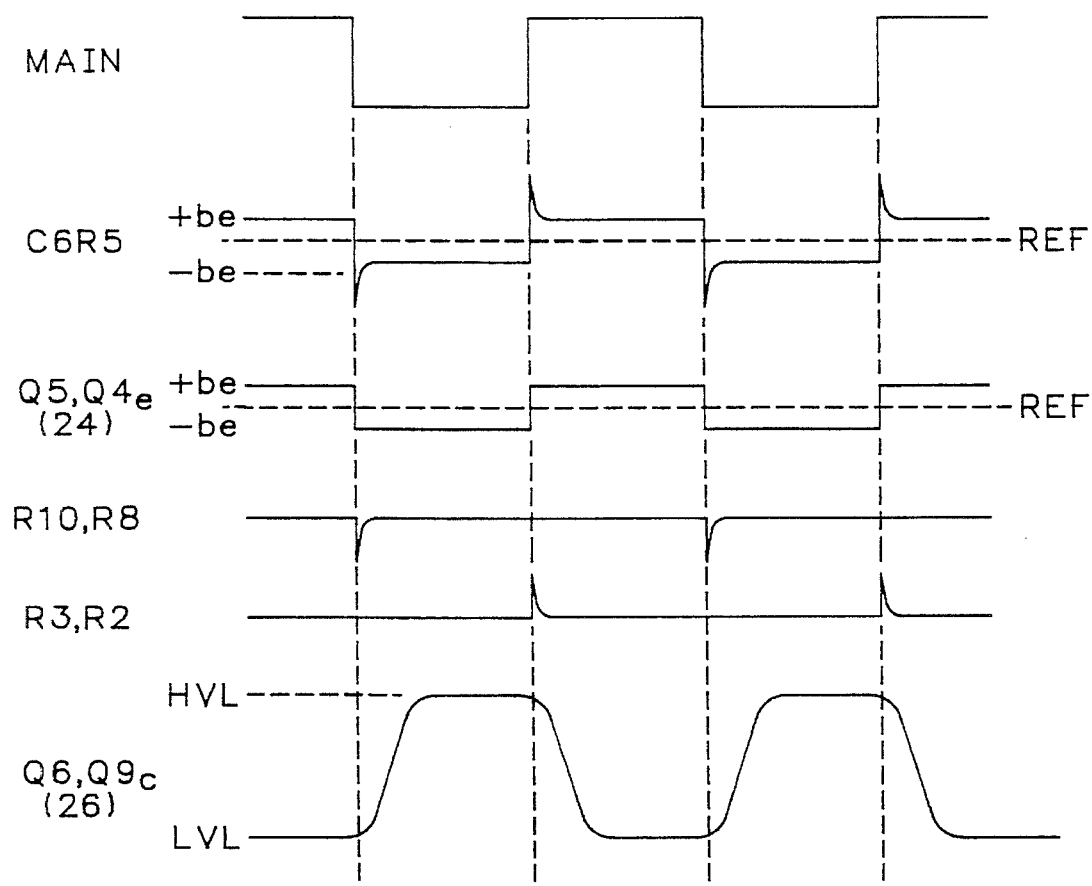
FIG. 3 is a timing diagram for the CCD gate driver of FIG. 2.

Referring now to FIG. 3 in operation an input signal MAIN is applied to the input terminal 20 in the form of a square wave clock signal. The voltage at the junction of resistor R5 and capacitance C6 initially peaks in the direction of the transition of the input signal MAIN and then decays to a value that is one base-emitter voltage drop from the reference voltage level. The resulting signal at the emitters of the complementary input transistors Q5, Q4 is a signal that is the same as the input signal MAIN, but with an amplitude that varies between one base-emitter voltage drop above to one base-emitter voltage drop below the reference voltage level. The voltage at the emitters of the upper current mirror transistors Q1, Q2, Q3 is at the positive voltage rail +V except during the transition of the input signal MAIN in one direction. Likewise the voltage at the emitters of the lower current mirror transistors Q7, Q8 are at the negative voltage rail −V except during the transition of the input signal MAIN in the other direction. The output voltage at the collectors of the complementary output transistors Q6, Q9 transition from one voltage limit level to the other depending upon which current mirror provides current during the transition. The rate of change of the transition between the voltage limit levels HVL, LVL at the output node 28 is a function of the CCD gate capacitance, the input current through resistor R5, and the current mirror gain. The output series resistor R6 damps ringing from the lead inductance and CCD gate capacitance.

Figure 4:
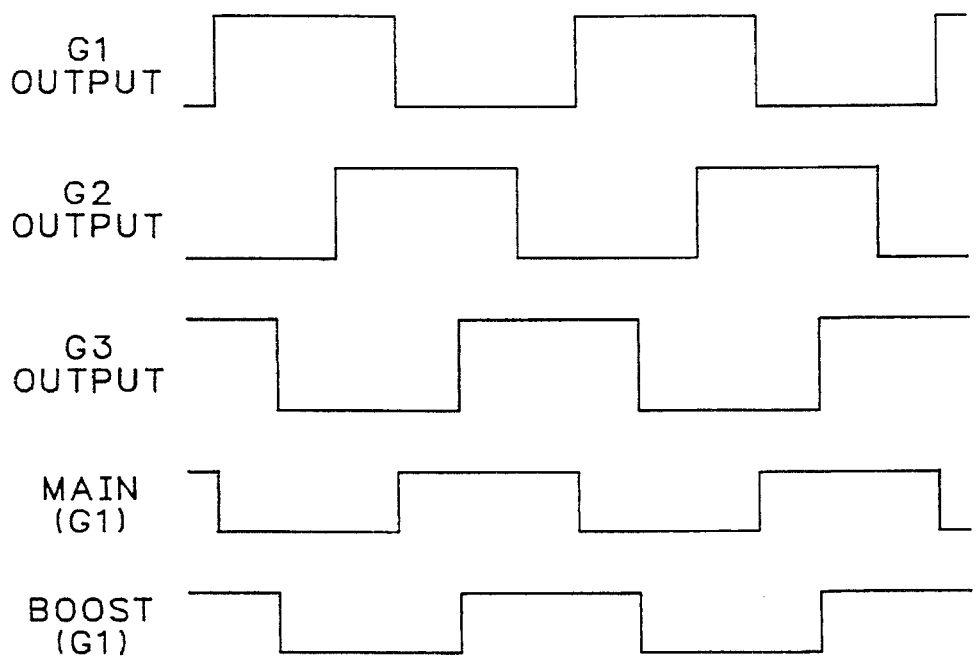
FIG. 4 is a timing diagram of output drive signals for a multiple gate CCD.

For a three gate CCD device the three clock drive signals are staggered 120° apart in phase, as shown by signals G1, G2, G3 in FIG. 4. As is apparent two of the three signals tend to reinforce each other through the overlap capacitance between the gates, while two others of the three signals tend to oppose each other. For example referring to the first two signals, G1, G2, the positive transition of G2 occurs when G1 is already positive and the negative transition of G2 occurs when G1 is already negative. This reinforcement tends to send the saturated one of the complementary output transistors Q6, Q9 deeper into saturation, i.e., drawing more current. The diodes CR1, CR2 together with the associated capacitors C4, C3 act as current sinks for the additional current provided by the reinforcing signal coupled from G2.

This keeps the complementary output transistor Q6, Q9 that is saturated in saturation without overdriving it so that when the opposite transition occurs the switching between the complementary output transistors occurs rapidly.

On the other hand signal G3 tends to bring the saturated one of the complementary output transistors Q6, Q9 out of saturation, which would cause the output level of signal G1 to change. Therefore an inverted version of the clock signal applied to the CCD driver circuit 10 that produces the G3 signal is applied to the other input terminal 22 as a BOOST signal to inject a current into the drive circuit to oppose the effect of the overlap capacitance due to the G3 signal. The voltage divider network R4, R7 acts to supply a trickle current that maintains via the current mirrors 16, 18 the one of the complementary output transistors Q6, Q9 in saturation, thus minimizing the power requirements of the circuit during the periods between transitions. This allows the transistors of the drive circuit to switch rapidly, but still stay in saturation.

The values of the series RC networks coupled between the input terminals 20, 22 are determined from the amount of current desired from the input signal and the capacitance of the particular CCD gate being driven. Since the input reference voltage REF is independent of the output voltage level rails HVL, LVL, each complementary output transistor Q6, Q9 saturates when its collector reaches the corresponding rail to produce a symmetrical output. The MAIN input signal drives both the CCD gate and the intergate coupling capacitors, while the BOOST input signal only drives the intergate coupling capacitor.

Thus the present invention provides a CCD gate driver circuit that provides a symmetrical drive signal in response to an input clock signal at high frequencies by decoupling the input reference voltage from the output rails, by providing significant current only during transitions of the clock signal, and by sinking or compensating for overlap capacitive coupling between the CCD gates.

What is claimed is:

1. A CCD gate driver circuit comprising:

an input circuit having a pair of emitter coupled complementary transistors for receiving an input clock signal at a first input terminal and a compensation signal at a second input terminal, the first and second input terminals being coupled to the emitters at an input node to produce a switching current at the collectors of the transistors during transitions of the input clock signal and to produce a compensating current pulse in response to transitions of another clock signal provided as the compensation signal, the other clock signal being associated with another gate of the CCD driver to compensate for overlap capacitance between the gates;

an output circuit for providing an output drive signal in response to a current input signal, the output drive signal having levels determined by a pair of output voltage rails; and means between the collectors and the output circuit for coupling the switching current from the input circuit as the current input signal for the output circuit so that the output drive signal follows the input clock signal.

2. The CCD gate driver as recited in claim 1 wherein the input circuit further comprises a series RC circuit such that the compensating current pulse is produced during transitions of the other clock signal.

3. A CCD gate driver circuit comprising:

an input circuit having a pair of emitter coupled complementary transistors for receiving an input clock signal at a first input terminal coupled to the emitters at an input node to produce a switching current at the collectors of the transistors, the switching current occurring during the transitions of the input clock signal;

an output circuit for providing an output drive signal in response to a current input signal, the output drive signal having levels determined by a pair of output voltage rails;

means between the collectors and the output circuit for coupling the switching current from the input circuit as the current input signal for the output circuit so that the output drive signal follows the input clock signal; and means coupled to the input node and the first input terminal for providing a trickle current from the input circuit to the output circuit via the coupling means during steady state levels of the input clock signal between transitions to minimize power requirements between transitions and to provide rapid switching of the output drive signal.

4. The CCD gate driver as recited in claim 3 wherein the trickle current providing means comprises a resistive divider network coupled between the first input terminal and a predetermined power supply rail, the resistive divider network having a node coupled to the input node to provide the trickle current.

5. A CCD gate driver circuit comprising:

an input circuit having a pair of emitter coupled complementary transistors for receiving an input clock signal at a first input terminal coupled to the emitters at an input node to produce a switching current at the collectors of the transistors, the switching current occurring during the transitions of the input clock signal;

an output circuit having a pair of complementary output transistors with the collectors tied together to form an output node that is coupled to an output terminal, with the emitters coupled to receive a current input signal, and with each base coupled to respective ones of a pair of output voltage rails;

means coupled to the output node and the respective bases for sinking excess current to prevent overdriving the pair of complementary output transistors; and means between the collectors and the output circuit for coupling the switching current from the input circuit as the current input signal for the output circuit so that the output drive signal follows the input clock signal.

6. The CCD gate driver as recited in claim 5 wherein the sinking means comprises:

a pair of diodes connected in series between the bases of the complementary output transistors, the junction between the diodes being coupled to the output node; and a pair of capacitors, each coupled between the respective base and a return voltage level.

* * * * *